US008441247B2

(12) United States Patent
Ha et al.

(10) Patent No.: US 8,441,247 B2
(45) Date of Patent: May 14, 2013

(54) CONTINUOUS CRITICAL CURRENT MEASUREMENT APPARATUS AND METHOD OF MEASURING CONTINUOUS CRITICAL CURRENT USING THE SAME

(75) Inventors: Hong-Soo Ha, Changwon-si (KR); Seok-ho Kim, Gimhae-si (KR); Ki-deok Sim, Gimhae-si (KR); Sang-su Oh, Gimhae-si (KR); Min-won Park, Gimhae-si (KR)

(73) Assignee: Korea Electrotechnology Research Institute (KR)

( * ) Notice: Subject to any disclaimer, the term of this patent is extended or adjusted under 35 U.S.C. 154(b) by 365 days.

(21) Appl. No.: 12/840,173

(22) Filed: Jul. 20, 2010

(65) Prior Publication Data

US 2011/0140710 A1 Jun. 16, 2011

(30) Foreign Application Priority Data

Dec. 14, 2009 (KR) .................. 10-2009-0123867

(51) Int. Cl.
*G01N 27/00* (2006.01)
*G01R 19/00* (2006.01)

(52) U.S. Cl.
USPC ........................ 324/71.6; 324/76.11

(58) Field of Classification Search ............... 324/537,
324/500, 71.6, 444, 76.11, 177, 248, 522,
324/713, 348, 370; 702/1, 57, 64, 108, 115,
702/127
See application file for complete search history.

(56) References Cited

U.S. PATENT DOCUMENTS

| 5,134,360 | A | * | 7/1992 | Martin et al. ................. 324/71.6 |
| 5,936,394 | A | * | 8/1999 | Kaneko et al. .................. 324/72 |
| 6,034,527 | A | * | 3/2000 | Schiller et al. ................ 324/235 |
| 6,452,375 | B1 | * | 9/2002 | Coulter et al. ............. 324/76.11 |
| 2006/0073977 | A1 | * | 4/2006 | Xie et al. ........................ 505/300 |
| 2010/0227765 | A1 | * | 9/2010 | Ueno et al. .................... 505/310 |

FOREIGN PATENT DOCUMENTS

| JP | 1998-002890 A | 1/1998 |
| JP | 2004-028901 A | 1/2004 |
| KR | 10-2009-0083722 A | 8/2009 |

* cited by examiner

*Primary Examiner* — Hoai-An D Nguyen
(74) *Attorney, Agent, or Firm* — Park & Associates IP Law, P.C.

(57) ABSTRACT

The present invention relates to an apparatus and method for measuring the critical current of a superconducting tape. A continuous critical current measurement apparatus for measuring critical current of a superconducting tape while feeding a superconducting tape in a liquid nitrogen container includes wheel-type current terminals and wheel-type voltage terminals. The superconducting tape is continuously supplied and fed by a reel-to-reel device, and the critical current of the superconducting tape is measured in real time using the wheel-type current terminals and the wheel-type voltage terminals while the superconducting tape is fed at constant linear velocity in contact with the wheel-type current terminals and the wheel-type voltage terminals. Accordingly, current is applied using wheel-type current terminals and voltage is measured using wheel-type voltage terminals while a superconducting tape is continuously supplied by a reel-to-reel device, thus continuously measuring critical current without burning out the superconducting tape.

17 Claims, 6 Drawing Sheets

(Linearization the control voltage)

CONTINUOUS CRITICAL CURRENT MEASUREMENT APPARATUS AND METHOD OF MEASURING CONTINUOUS CRITICAL CURRENT USING THE SAME

FIELD OF THE INVENTION

The present invention relates, in general, to an apparatus for measuring the critical current of a superconducting tape, and, more particularly, to a continuous critical current measurement apparatus, which can continuously measure the critical current of a superconducting tape using wheel-type current and voltage terminals without burning out the superconducting tape while continuously supplying the superconducting tape using a reel-to-reel device.

Further, the present invention relates to a method of continuously measuring the critical current of a superconducting tape, which measures the current, required to control the voltage of a superconducting tape at 0.1 mV per meter, as critical current by moving the superconducting tape at regular time intervals using a continuous critical current measurement apparatus, thus reducing the time required for the measurement of critical current and accurately measuring the critical current.

BACKGROUND OF THE INVENTION

At this time when the industrialization of superconducting tapes (or wires) is ongoing, fast manufacturing speed is required, a fast and accurate measurement method of determining the quality of superconducting tapes is required in conjunction with the fast manufacturing speed, and a method of promptly and accurately measuring the quality of superconducting tapes without causing damage to (burning out) the superconducting tapes is also required.

A conventional method of measuring the critical current of a superconducting tape is a four-terminal critical current measurement method, which is configured such that two current terminals are arranged on a superconducting tape and voltage terminals are interposed between the current terminals, and current is conducted to the current terminals, thus measuring the critical current of the superconducting tape.

Since such a method allows current to be directly conducted to the tape, relatively accurate critical current can be obtained. However, such a method is disadvantageous in that a superconducting tape may easily burn out due to overcurrent occurring during the measuring of critical current, a load applied to the tape on account of current and voltage terminals, and a soldering operation performed when the terminals for measurement are formed. Further, such a method is unsuitable for measuring the critical current of a long tape. Therefore, in order to measure the critical current of a long tape, a contact critical current measurement method, which measures the voltage while allowing current to flow into the tape by means of physical contact of individual terminals without soldering, must be introduced.

As a conventional method of measuring the critical current of a long tape, two types of methods have been mainly used.

A first type is a scheme for measuring the critical current of a superconducting tape in a batch type, and is configured such that the superconducting tape is caused to pass through a space between two superconducting tape guide rollers disposed in a liquid nitrogen container. Further, a support is formed below the superconducting tape so as to prevent the tape from hanging down. Further, to measure critical current based on a four-terminal method, four terminals are sequentially arranged on a high-temperature superconducting tape as a (+) current terminal, a (+) voltage terminal, a (−) voltage terminal and a (−) current terminal, respectively, so that when the terminals are moved downwards from above and come into contact with the superconducting tape, the voltage of the superconducting tape is measured at the voltage terminals while current is flowing through the current terminals.

A second type is an apparatus for measuring critical current while continuously supplying a tape along guide rollers, and is configured such that a superconducting tape passes through a space between the guide rollers disposed in a liquid nitrogen container. Here, one guide roller also serves as a (+) current terminal and the other guide roller also serves as a (−) current terminal. In this way, the guide rollers not only feed the superconducting tape, but also serve to apply current to the superconducting tape. Therefore, in order to measure voltage in the state in which the superconducting tape is moving, separate terminals are required. A roller for a (+) voltage terminal and a roller for a (−) voltage terminal serve as voltage terminals. In order to use a continuous critical current measurement apparatus, contact resistance can be reduced only when the force of contact between the superconducting tape guide rollers and the superconducting tape must be increased by strongly pulling the superconducting tape disposed between the superconducting tape guide rollers. Therefore, this method is suitable for the measurement of the critical current of a high-strength superconducting tape.

However, since high-temperature superconducting tapes which have been developed to date use silver (Ag) or an alloy of silver as the outer surfaces thereof, they are of low strength. Therefore, due to the low-strength characteristics of superconducting tapes, it is almost impossible to use a continuous critical current measurement apparatus, and thus a batch-type critical current measurement apparatus must be used.

Further, a conventional batch-type critical current measurement apparatus is capable of measuring critical current (Ic) only in a contact manner, and uses pressure applied to current and voltage terminals as an important variable. That is, during a procedure for applying pressure to ensure a sufficiently large contact area in the current terminals for current conduction, a superconducting tape may burn out due to overpressure. Further, when the pressure is excessively low, measurement errors occur due to contact resistance when the current is conducted. Further, similarly to the voltage terminal, when applied pressure is excessively low, noise may occur during voltage measurement, whereas when applied pressure is excessively high, burning out of the superconducting tape may be caused. Therefore, a measurement apparatus capable of ensuring the accuracy and reliability of the measurement of critical current (Ic) must be constructed.

As related arts using such a batch-type critical current measurement apparatus and a continuous critical current measurement apparatus, there are patents disclosed in Korean Pat. No. 0513208 and U.S. Pat. Nos. 5,936,394 and 7,554,31782.

Those related arts do not disclose the measurement of continuous critical current in the strict sense. That is, in those patents, the critical current of a superconducting tape is not measured while the superconducting tape is continuously fed, but is measured in the state in which the feeding of the tape stops and both a planar terminal capable of applying current and another planar terminal for measuring voltage press the superconducting tape at the time of measuring critical current. If a long superconducting tape is measured, an operation of raising and lowering a current or voltage terminal must be repeated in such a go-and-stop manner, and thus there is a disadvantage in that a lot of time is required for the measurement of critical current especially for a long superconducting tape. Further, those patents are problematic in that, since average critical current is measured, local defects cannot be found, so that the characteristics of a superconducting tape are not properly evaluated, and measurement resolution is limited. Furthermore, in the case of technology disclosed in U.S. Pat. No. 7,554,317B2, since a current terminal is formed to be of a wheel type, current can be continuously applied, but a voltage terminal is not formed to be of a wheel type, thus making it impossible to properly perform continuous processing.

In addition, in those conventional schemes, current is supplied mainly in a line contact manner to guide rollers or wheel-type terminals which are used for the feeding of a superconducting tape and are used as voltage or current terminals, and thus there are advantageous in that conduction current is not high and contact resistance is large due to an increase in rotational friction.

Furthermore, the conventional schemes are disadvantageous in that the force of contact between the superconducting tape and the current and voltage terminals decreases, thus increasing contact resistance, and in that it is impossible to measure voltage between current and voltage terminals, thus making it difficult to measure critical currents on all areas of the superconducting tape.

SUMMARY OF THE INVENTION

Accordingly, the present invention has been made keeping in mind the above problems occurring in the prior art, and an object of the present invention is to provide a continuous critical current measurement apparatus, which can continuously measure the critical current of a superconducting tape using wheel-type current and voltage terminals without burning out the superconducting tape while continuously supplying the superconducting tape using a reel-to-reel device.

Another object of the present invention is to provide a continuous critical current measurement apparatus, which not only can measure critical current using voltage terminals disposed between current terminals but also can measure voltages in all sections in which current is being conducted because voltage terminals are also provided outside the current terminals.

A further object of the present invention is to provide a continuous critical current measurement method, which measures current, required to control voltage of a superconducting tape at 0.1 mV per meter while moving the superconducting tape at regular time intervals by using the continuous critical current measurement apparatus, as critical current, thus shortening the time required for the measurement of the critical current and accurately measuring the critical current.

In order to accomplish the above objects, the present invention provides a continuous critical current measurement apparatus for measuring critical current of a superconducting tape while feeding the superconducting tape in a liquid nitrogen container, comprising wheel-type current terminals; and wheel-type voltage terminals, wherein the superconducting tape is continuously supplied and fed by a reel-to-reel device, and the critical current of the superconducting tape is measured in real time using the wheel-type current terminals and the wheel-type voltage terminals while the superconducting tape is fed at constant linear velocity in contact with the wheel-type current terminals and the wheel-type voltage terminals.

Preferably, each of the voltage terminals comprises an inside voltage terminal disposed inside a corresponding current terminal with respect to a feeding path of the superconducting tape and an outside voltage terminal disposed outside the corresponding current terminal with respect to the feeding path.

Preferably, the continuous critical current measurement apparatus further comprises a supporting bar or a supporting roller formed between the inside voltage terminals and configured to support the superconducting tape that is fed.

Preferably, the continuous critical current measurement apparatus further comprises a plurality of feed reels formed between the inside voltage terminals and configured to allow the superconducting tape to be wound around the feed reels in multiple turns, thus enabling critical current corresponding to a length of the wound superconducting tape to be measured.

Preferably, the superconducting tape in contact with the current terminals is fed in contact with more than a half of a circumference of each of the current terminals.

Preferably, the superconducting tape in contact with the voltage terminals is fed in a direction having a slope less than that of a tangent line at a point of a contact end of the superconducting tape in contact with the current terminals.

Preferably, each of the current terminals and the voltage terminals is formed as a wheel type terminal, and is configured such that a tape receiving groove is formed along a circumference of the current or voltage terminal and such that a brush contact part is formed to protrude backwards from a center portion of the current or voltage terminal and is configured to apply current and measure voltage. Further, the current terminals and the voltage terminals are configured to perform current application and voltage measurement using a brush-type current lead-in structure and a brush-type voltage measurement structure, respectively.

In this case, each of the brush-type current lead-in structure and the brush-type voltage measurement structure comprises one or more brush parts formed in contact with the brush contact part to correspond to a curvature of the brush contact part; and conducting wire parts connected to an external terminal so as to apply current to the brush parts or measure voltage at the brush parts. The brush parts are connected to each other as one pair by a spring, thus adjusting contact pressures of the brush parts.

Preferably, each of the brush-type current lead-in structure and the brush-type voltage measurement structure comprises brush parts formed in contact with the brush contact part to correspond to a curvature of the brush contact part, and formed as at least one pair; control arms respectively connected to the brush parts of the pair to form a predetermined angle therebetween and connected to each other by a spring, thus adjusting contact pressures of the brush parts and balancing the brush parts; and conducting wire parts inserted into the control arms through first ends of the control arms and electrically connected to the brush parts, thus supplying current.

Preferably, the superconducting tape is fed at constant velocity by a velocity control unit.

Preferably, reference voltage is applied to the superconducting tape, current generated by the reference voltage is set to the critical current, and current is bypassed to a bypass shunt when abnormal current occurs.

Further, the present invention provides a continuous critical current measurement method, comprising inputting voltage at both ends of the superconducting tape, which is measured at the voltage terminals, to a Digital Signal Processor (DSP) through an amplifier and an Analog Digital Converter (ADC) by using the continuous critical current measurement apparatus, thus measuring voltage at both ends of the superconducting tape; applying current to the current terminals while controlling a current source via a Digital Analog Converter (DAC) so as to maintain the measured voltage at 0.1 mV per meter; and measuring the current applied to the current terminals and tracking current, which is applied to maintain the voltage at 0.1 mV per meter, thus measuring critical current of the superconducting tape, wherein the voltage measured at the voltage terminals is proportional to an n-th power of the current, so that the critical current is linearized by obtaining an 1/n-th power (where n=10~40) of the measured voltage, thus supplying the linearized critical current to the DAC.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, embodiments of an apparatus for measuring the critical current of a superconducting tape according to the present invention will be described in detail with reference to the attached drawings.

Figure 1:
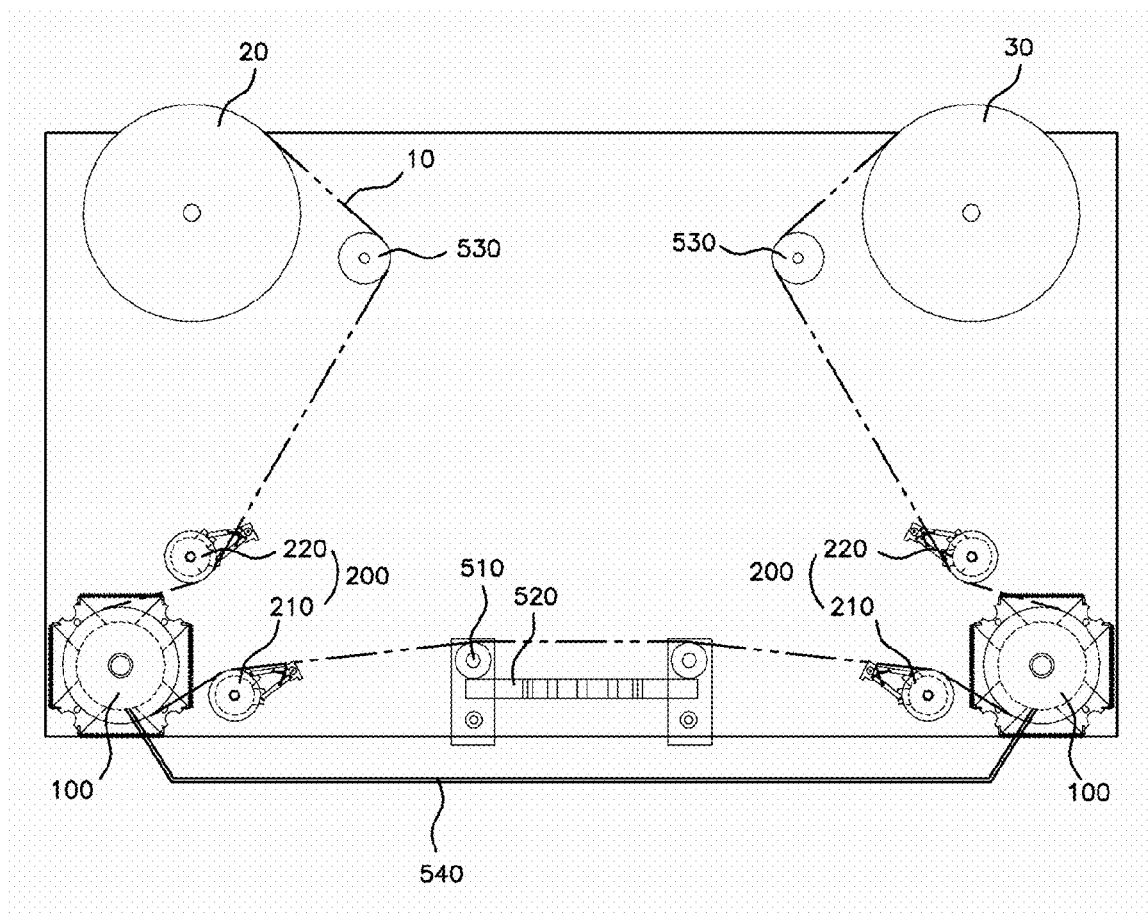
FIG. 1 is a diagram showing the construction of principal components of a continuous critical current measurement apparatus according to the present invention.
Figure 2:
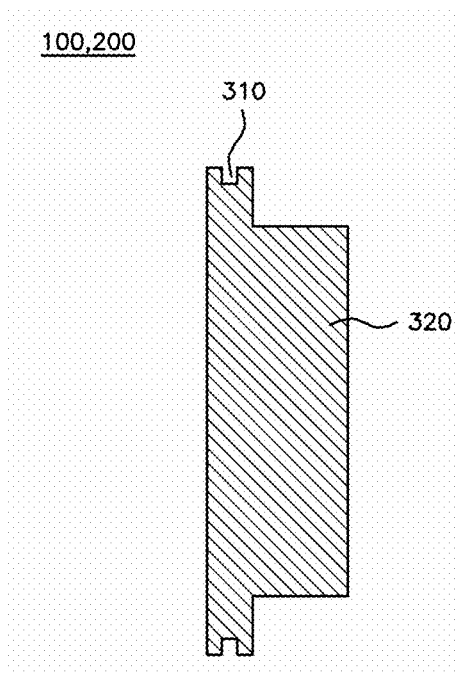
FIG. 2 is a sectional view of the current terminal or voltage terminal of the continuous critical current measurement apparatus according to the present invention.
Figure 3:
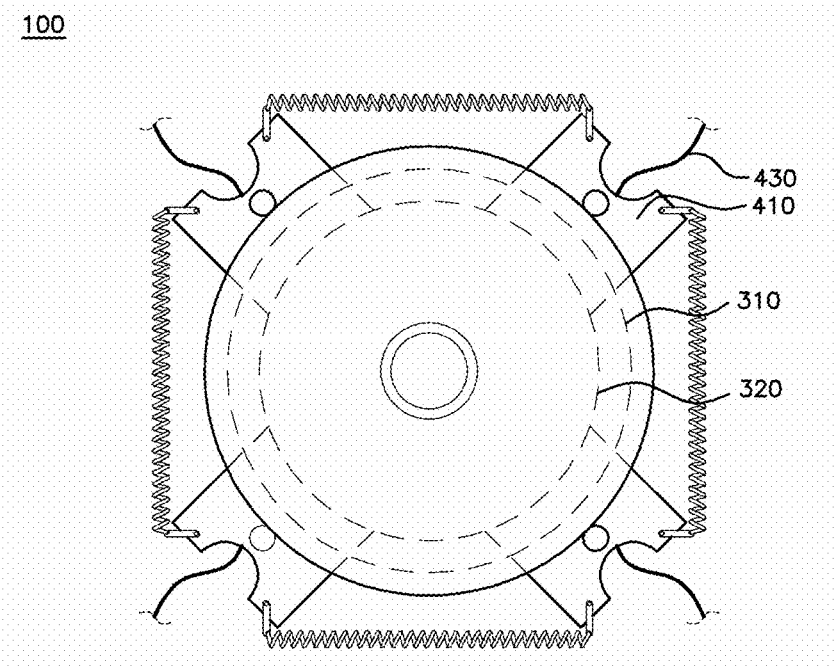
FIG. 3 is a diagram showing the brush-type current lead-in structure or brush-type voltage measurement structure of the continuous critical current measurement apparatus according to an embodiment of the present invention.
Figure 4:
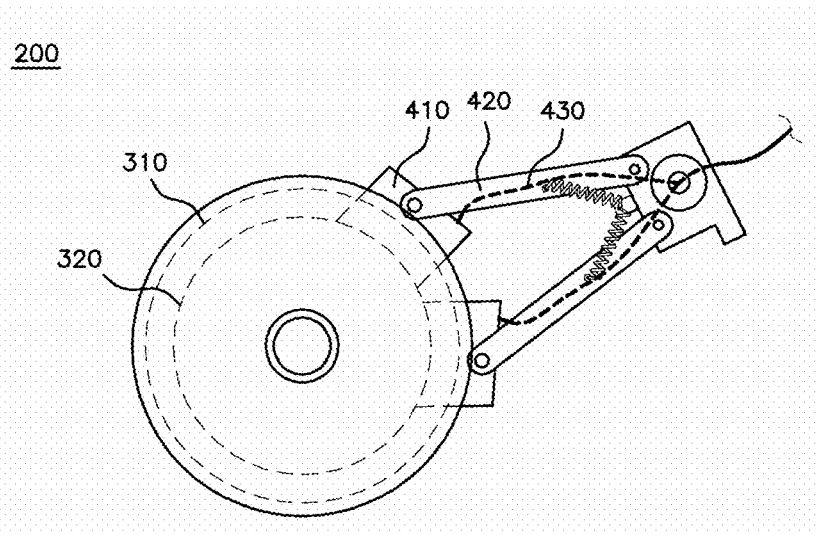
FIG. 4 is a diagram showing the brush-type current lead-in structure or brush-type voltage measurement structure of the continuous critical current measurement apparatus according to another embodiment of the present invention.
Figure 5:
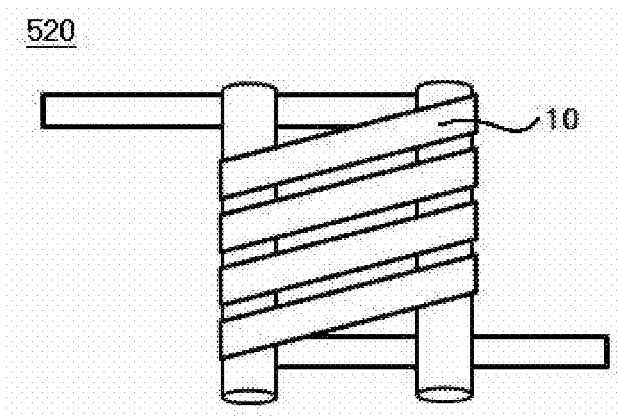
FIG. 5 is a perspective view of the feed reel of the continuous critical current measurement apparatus according to the present invention.

FIG. 1 is a diagram showing the construction of principal components of a continuous critical current measurement apparatus according to the present invention, FIG. 2 is a sectional view of the current terminal or voltage terminal of the continuous critical current measurement apparatus according to the present invention, FIG. 3 is a diagram showing the brush-type current lead-in structure or brush-type voltage measurement structure of the continuous critical current measurement apparatus according to an embodiment of the present invention, FIG. 4 is a diagram showing the brush-type current lead-in structure or brush-type voltage measurement structure of the continuous critical current measurement apparatus according to another embodiment of the present invention, and FIG. 5 is a perspective view of the feed reel of the continuous critical current measurement apparatus according to the present invention;

The present invention relates to an apparatus capable of continuously measuring the critical current of a superconducting tape 10, in particular, a long superconducting tape 10 supplied by a reel-to-reel device, and is configured to continuously measure the critical current of the superconducting tape 10 while feeding the superconducting tape 10 in a liquid nitrogen container.

In this case, the term "reel-to-reel device" means a device which includes a supply reel 20 for supplying the superconducting tape 10 and a winding reel 30 for winding the superconducting tape 10, the measurement of the characteristics of which has been completed, and in which a motor rotating at constant speed is connected to the winding reel 30 to enable the superconducting tape 10 to be fed at constant linear velocity.

The supply reel 20 and the winding reel 30 need not be accommodated in the liquid nitrogen container. The superconducting tape 10 is rotated while the tension thereof is controlled to correspond to a certain tension value applied to the motor. A velocity control unit 530 such as an encoder is formed to be adjacent to the supply reel 20 or the winding reel 30 so as to measure the feed distance and velocity of the superconducting tape 10 in real time and feed the superconducting tape 10 at constant velocity.

In this way, while the superconducting tape 10 is continuously supplied and fed by the reel-to-reel device, wheel-type current terminals 100 and wheel-type voltage terminals 200 are formed on a path along which the superconducting tape 10 moves and which is disposed between the supply reel 20 and the winding reel 30. Accordingly, critical current can be measured in real time while the superconducting tape 10 is in contact with the current terminals 100 and the voltage terminals 200 and is fed at constant linear velocity. This structure measures critical current by winding the superconducting tape 10 instead of pressing it, thereby preventing the superconducting tape 10 from burning out.

All components of the reel-to-reel device for the measurement of critical current are formed to be fixed on a Fiber-Reinforced Plastic (FRP) plate or the like made of an insulating material which is chemically stabilized even if it is immersed in liquid nitrogen. At the time of measuring critical current, the inside of the reel-to-reel device is tightly shut from the outside thereof, and the FRP plate to which all of the components are fixed is immersed below the encoders in the liquid nitrogen container, and thus the critical current is measured.

Basically, the critical current according to the present invention is measured by a four-terminal method in such a way that (+) and (−) current terminals 100 are formed at both ends of any section of the superconducting tape 10 and (+) and (−) voltage terminals 200 are formed between the current terminals 100, so that voltage corresponding to the applied current is measured, and then the critical current is measured.

Further, the current terminals 100 are wheels for transmitting current to the superconducting tape 10 so as to measure the conduction characteristics and critical current of the superconducting tape 10, and are made of copper (Cu) coated with gold (Au). The voltage terminals 200 are wheels for measuring voltage generated at the superconducting tape 10, and are made of stainless steel or the like which is a metal having corrosion resistance.

Furthermore, each of the voltage terminals 200 includes an inside voltage terminal 210 disposed inside the current terminal 100 with respect to the feeding path of the superconducting tape 10, and an outside voltage terminal 220 disposed outside the current terminal 100 with respect to the feeding path. The inside voltage terminals 210 are configured to measure the critical current of the superconducting tape 10 which is being fed therebetween, and the outside voltage terminals 220 are configured to measure the critical current in regions between the inside voltage terminals 210 and the current terminals 100. Generally, the four-terminal method implemented by the current terminals 100 and the inside voltage terminals 210 can measure only the critical current between the inside voltage terminals 210. When a defect is present on the superconducting tape 10 disposed between the inside voltage terminals 210 and the current terminals 100, the superconducting tape 10 may burn out because the defect at that location cannot be found. Therefore, each of the outside voltage terminals 220 is configured such that a voltage terminal is installed even outside a corresponding current terminal 100 to enable voltage to be measured in all sections in which current is being conducted, thus preventing the superconducting tape 10 from burning out.

Further, the superconducting tape 10 in contact with the current terminals 100 is fed in contact with more than a half of the circumference of each of the current terminals 100, so that current is stably supplied to the superconducting tape 10. In this case, each voltage terminal 200 is disposed inside the current terminal 100 with respect to the feeding path of the superconducting tape 10, so that the superconducting tape 10 in contact with the voltage terminal 200 is fed at an angle (in a direction) less than the slope of a tangent line at a point of the contact end of the superconducting tape 10 in contact with the current terminal 100. That is, the superconducting tape 10 is supplied to the current terminal 100 after being bent by the outside voltage terminal 220 at a predetermined angle, and is fed after being bent by the inside voltage terminal 210 at a predetermined angle. This is intended to stably apply current and measure voltage by inducing stable contact force between the superconducting tape 10 with the voltage terminal 200 and with the current terminal 100.

Meanwhile, as shown in FIG. 2, each of the current terminal 100 and the voltage terminal 200 is formed as a wheel type terminal, and is configured such that a tape receiving groove 310 is formed along the circumference of the current or voltage terminal and a brush contact part 320 is formed to protrude backwards from a center portion of the current or voltage terminal so as to apply current and measure voltage. That is, each of the current terminal 100 and the voltage terminal 200 is formed in a disc shape rotating around a shaft in its entirety. The tape receiving groove 310 is formed along the circumference of the current or voltage terminal to receive the superconducting tape 10 and come into contact with the superconducting tape 10. The cylindrical brush contact part 320 is formed to protrude backwards from the current or voltage terminal to allow a brush part 420, which will be described later, to come into contact with the brush contact part 320. Accordingly, constant current can be stably applied regardless of the rotation of the current terminal 100 and the voltage terminal 200, thus minimizing contact resistance.

Supporting bars or supporting rollers 510 for supporting the superconducting tape 10 which is fed are further formed between the current terminals 100, precisely, between the inside voltage terminals 210. These are intended to prevent a long superconducting tape 10 from hanging down at the time of measuring the critical current of the long superconducting tape because the long superconducting tape 10 may hang down when the distance between the inside voltage terminals 210 is excessively long.

Further, it is preferable that the application of current to each current terminal 100 and the measurement of voltage using each voltage terminal 200 be performed by a brush-type current lead-in structure and a brush-type voltage measurement structure, respectively. The brush-type current lead-in and voltage measurement structures allow brush parts 410 for conduction to come into surface contact with the brush contact part 320 of each of the current terminal 100 and the voltage terminal 200, and enable the application of constant current and the accurate measurement of voltage to be performed regardless of the rotation of each terminal. The brush-type current lead-in structure applies current to the edge of the current terminal 100 adjacent to the superconducting tape 10 without applying current to the central axis of the current terminal 100, thus minimizing current loss and enabling a more accurate current value to be applied to the current terminal 100.

In an embodiment of the brush-type current lead-in structure, the current terminal 100 includes one or more brush parts 410 and conducting wire parts 430, as shown in FIG. 3. The brush parts 410 are formed in contact with the brush contact part 320 to correspond to the curvature of the brush contact part 320, and the conducting wire parts 430 are connected to an external terminal to apply current to the brush parts 410, thereby applying current to the current terminal 100 through the brush parts 410. Further, the brush parts 410 of the current terminal 100 are formed as pairs according to the circumstances, and two brush parts 410 of each pair are connected to each other by a spring, so that the contact pressures of the brush parts 410 with the brush contact part 320 of the current terminal 100 can be adjusted. In other words, the brush parts 410 may be formed in a plural number according to current capacity. The brush parts 410 are formed as pairs with the brush parts 410 fixed on an FRP plate, and are connected to each other by springs. Therefore, the contact pressures of the brush parts 410 with the brush contact part 320 of the current terminal 100 can be adjusted while being balanced when the current terminal 100 is rotating. Of course, this structure may also be applied to the brush-type voltage measurement structure.

Further, in an embodiment of the brush-type voltage measurement structure, as shown in FIG. 4, the voltage terminal 200 includes brush parts 410, control arms 420, and conducting wire parts 430. The brush parts 410 are formed in contact with a brush contact part 320 to correspond to the curvature of the brush contact part 320 and are also formed as at least one pair. The control arms 420 are respectively connected to the brush parts 410, which are fixed on the FRP plate and are formed as a pair, to form a predetermined angle therebetween. The control arms 420 are connected to each other by a spring and are configured to adjust the contact pressures of the brush parts 410 and to balance the contact pressures. The conducting wire parts 430 are inserted into the respective control arms 420 through the first ends of the control arms 420 and are electrically connected to the brush parts 410, thus supplying current to the brush parts 410. The voltage is measured at the voltage terminal 200 through the brush parts 410. That is, the brush parts 410 are formed at the ends of the two control arms 420, and the control arms 420 are connected to each other by a spring, like elastic nippers, thus inducing uniform contact pressures of the brush parts 410 with the brush contact part 320. Of course, this structure may also be applied to the brush-type current lead-in structure.

In particular, in the brush-type current lead-in structure in contact with the current terminal 100, at least two (two, four or six) brush parts 410 are formed, so that the contact area of the brush parts 410 with the brush contact part 320 is increased, and thus contact resistance is decreased and conduction current is increased. The two brush parts 410 forming a pair enable the contact pressures thereof to be adjusted by the spring, thus decreasing rotational friction between the current terminal 100 and the brush parts 410. Further, in the brush-type voltage measurement structure in contact with the current terminal 100, about two brush parts 410 are preferably formed to accurately and stably measure voltage. The conducting wire parts 430 are connected to the respective brush parts 410, but are combined and connected to an external terminal for voltage measurement as a single conducting wire part 430.

In this case, the brush parts 410 are configured to supply current to the current terminal 100 that is rotating and to measure voltage at the voltage terminal 200 that is rotating, and are made of a metallic material having small rotational friction and low contact resistance, for example, an alloy of carbon and copper.

Further, as shown in FIG. 5, a plurality of (two in FIG. 5) feed reels 520 is formed between the inside voltage terminals 210 and is configured to allow the superconducting tape 10 to be wound around the feed reels 520 in multiple turns, so that critical current corresponding to the length of the wound superconducting tape 10 can be measured, and the critical current of even a long superconducting tape 10 can also be measured. That is, when a plurality of feed reels 520, for example, a total of four feed reels 520 including two upper feed reels and two lower feed reels, are formed between the inside voltage terminals 210, and the superconducting tape 10 is fed while being wound around the feed reels in multiple turns, the long superconducting tape 10 having a length corresponding to the multiple turns is present between the inside voltage terminals 210, and thus the critical current is measured at both the inside voltage terminals 210. A detailed construction thereof is disclosed in detail in Korean Pat. Appln. No. 10-2007-0110228 entitled 'superconducting tape feed apparatus' filed by the present applicant, and thus a detailed description thereof will be omitted.

Meanwhile, reference voltage is applied to the superconducting tape 10, and current generated by the reference voltage is set to critical current. When abnormal current occurs, that is, when a sudden decrease in critical current, disconnection of a tape, or current caused by resistance higher than resistance at reference voltage occurs, the current is allowed to be bypassed to a bypass shunt 540, thus preventing the superconducting tape 10 from burning out.

As described above, current is applied by the wheel-type current terminals 100 and voltage is measured at the wheel-type voltage terminals 200 while the superconducting tape 10 is continuously supplied by the reel-to-reel device, so that the critical current of the superconducting tape 10 can be continuously measured without burning out the superconducting tape 10. Further, the present invention not only can measure the characteristics of critical current by using the inside voltage terminals 210 between the current terminals 100, but also can measure voltage in all sections in which current is being conducted because the outside voltage terminals 220 are provided, thus preventing the superconducting tape 10 from burning out.

Further, contact resistance with the current terminals 100 and the voltage terminals 200 can be minimized and conduction current can be increased by the brush-type current lead-in structure and the brush-type voltage measurement structure, thus enabling the supply of stable current and the accurate measurement of voltage.

Next, a continuous critical current measurement method using the continuous critical current measurement apparatus will be described in detail with reference to the attached drawings.

The method of the present invention is configured to automatically measure critical current using the continuous critical current measurement apparatus in such a way that a Digital Signal Processor (DSP) controls voltage of a superconducting tape at 1 $\mu$V per meter by moving the superconducting tape at regular time intervals. By this method, the time required for the measurement of critical current is reduced, so that production costs can be reduced while production efficiency can be improved, and the accurate measurement of critical current can be performed.

Figure 6:
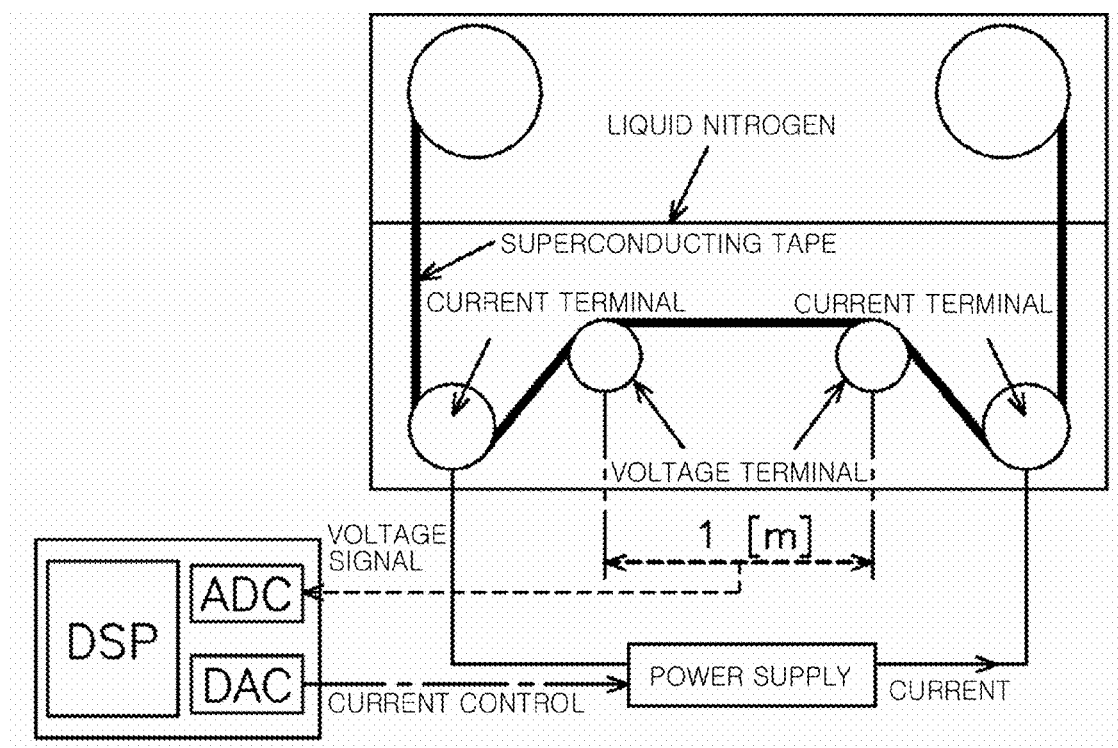
FIG. 6 is a block diagram showing the schematic construction of the continuous critical current measurement apparatus and a continuous critical current measurement method according to the present invention.
Figure 7:
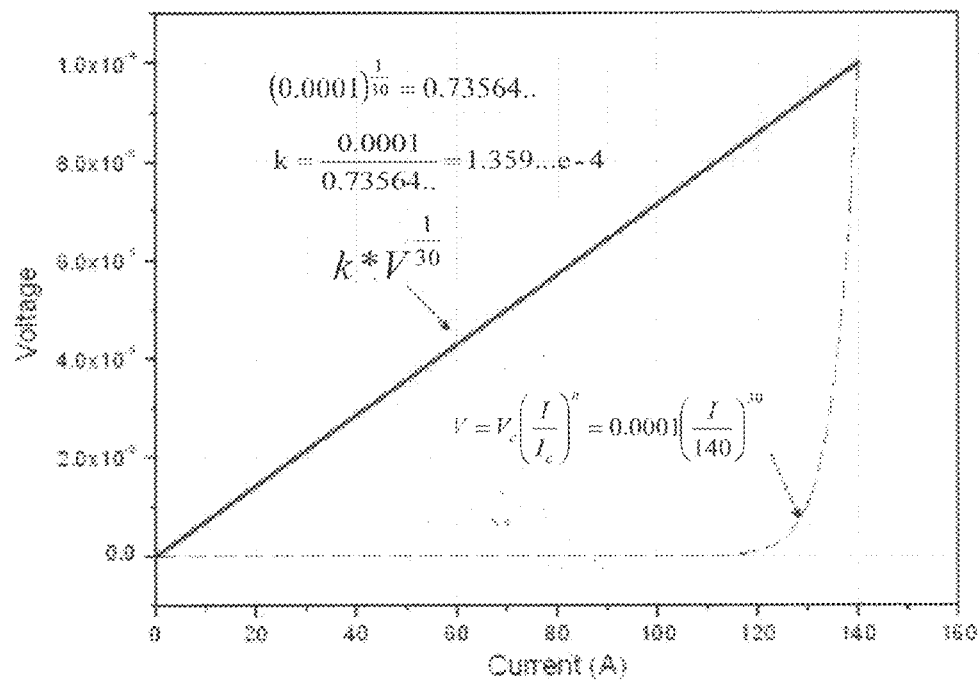
FIG. 7 is a diagram showing formulas for linearizing non-linear critical current.
Figure 8:
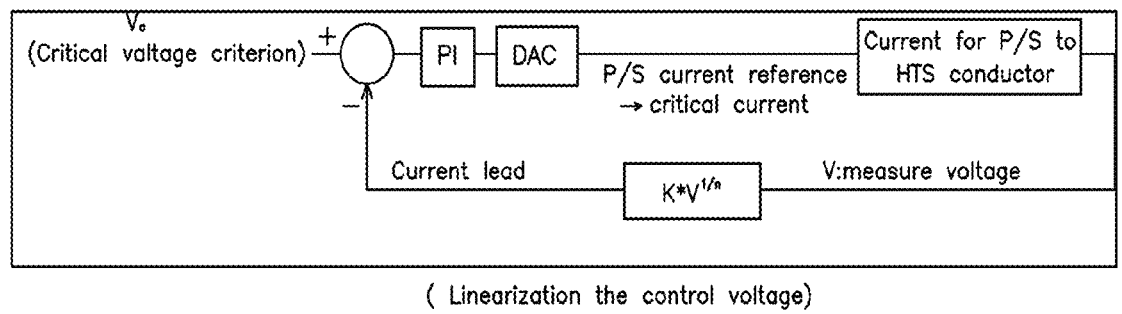
FIG. 8 is a flow diagram showing a control algorithm for measuring the continuous critical current of a superconducting tape using a Digital Signal Processor (DSP)
Figure 9:
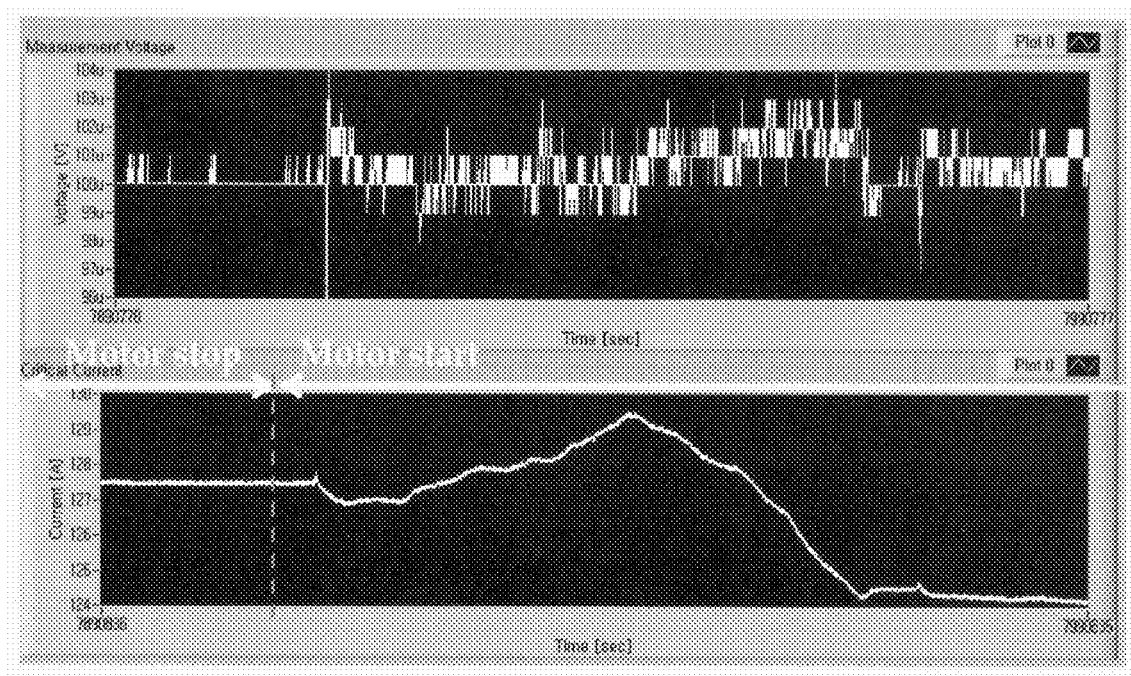
FIG. 9 is a diagram showing the results of measurement of the continuous critical current of a Bismuth Strontium Calcium Copper Oxide (BSCCO) tape.

FIG. 6 is a block diagram showing the schematic construction of the continuous critical current measurement apparatus to describe the continuous critical current measurement method of the present invention and showing the continuous critical current measurement method using the schematic construction, FIG. 7 is a diagram showing formulas for linearizing non-linear critical current, FIG. 8 is a diagram showing a control algorithm for measuring the continuous critical current of a superconducting tape using a DSP, and FIG. 9 is a diagram showing the results of measurement of the continuous critical current of a Bismuth Strontium Calcium Copper Oxide (BSCCO) tape.

As shown in the drawings, the present invention proposes an apparatus for measuring the continuous critical current of a superconducting tape. The apparatus of the present invention employs a scheme in which wheel-type voltage terminals are installed at regular intervals of the superconducting tape immersed in liquid nitrogen, for example, at intervals of 1 m in this embodiment, and wheel-type current terminals are respectively installed outside the voltage terminals, and in which voltage corresponding to applied current is measured and critical current is then measured.

The voltage at both ends of the superconducting tape which is measured at the voltage terminals is input to the DSP through an amplifier and an Analog Digital Converter (ADC), and consequently the voltage at both ends of the superconducting tape is measured. In order to maintain the measured voltage at 0.1 mV per meter, the current is applied to the current terminals while a current source is controlled via a Digital Analog Converter (DAC). Such an applied current is measured, so that the current value applied to maintain the voltage at 0.1 mV per meter is tracked, and as a result, the critical current can be measured. This shows that the instantaneous measurement of continuous critical current is implemented in an interval of at least 1 m. When this process is performed while the superconducting tape is continuously fed, the measurement of the continuous critical current of a long superconducting tape can be performed within a short period of time. Further, when the length to be measured is set to 0.5 m, the voltage is controlled to be maintained at 0.05 mV per 0.5 m. In this case, it is possible to measure critical current to be twice as dense as that of the superconducting tape of 1 m at the same measurement speed as that of the superconducting tape of 1 m.

Meanwhile, since the voltage measured at the voltage terminals is proportional to the n-th power of current, the 1/n-th power (n=10~40) of the measured voltage is obtained to linearize the critical current and the linearized current is supplied to the DAC, and thus the critical current can be measured by linearly varying current corresponding to sudden voltage variation.

This process will be described in detail. The critical current of a superconducting tape is calculated by the following Equation (1), $$V = V_c = (I/I_c)^n$$

where is measured voltage, is critical current, is voltage at that time, and is a value of 10~40 in general in the case of a high-temperature superconducting tape. Referring to Equation (1), since voltage at both ends of the superconducting tape is proportional to the n-th power of the current, it may be difficult to control this voltage using a typical Proportional-Integral (PI) controller. Therefore, when a value of k which causes the measured voltage to be identical to the voltage controlled at 0.1 mV per meter is obtained by calculating the 1/n-th power of the measured voltage, the linearization of current is possible, as shown in the blue line of FIG. 7, thus enabling control to be performed by the PI controller. Here, when is 0.0001 V (0.1 mV) and n is 30, a value of k (k=0.0001/0.00011/30) is obtained to have the value shown in FIG. 7.

FIG. 8 is a diagram showing a control algorithm for measuring the continuous critical current of a superconducting tape using the DSP. In FIG. 8, a linearized value of critical current is input to the PI controller, is input to the DAC, and is then transferred to a current source. From the current source, the current is supplied to the superconducting tape so that 0.1 mV per meter is maintained.

FIG. 9 is a diagram showing the results of measuring the continuous critical current of a BSCCO tape from among high-temperature superconducting tapes, wherein measurement speed is set to 200 m/h. As shown in the drawing, the critical current of the superconducting tape is not measured as only an average value within a specific section, but is measured in real time as a continuous critical current appearing over the specific section or all sections of the superconducting tape, thus enabling the critical current to be promptly and accurately measured.

As described above, the present invention is advantageous in that current is applied using wheel-type current terminals and voltage is measured using wheel-type voltage terminals while a superconducting tape is continuously supplied by a reel-to-reel device, thus continuously measuring critical current without burning out the superconducting tape, and in that the characteristics of critical current can be measured using inside voltage terminals between current terminals and voltage can also be measured in all sections in which current is being conducted because outside voltage terminals are provided, thus preventing the superconducting tape from burning out.

Further, the present invention is advantageous in that contact resistance with current terminals and voltage terminals can be minimized and conduction current can be increased thanks to a brush-type current lead-in structure and a brush-type voltage measurement structure, thereby enabling the supply of stable current and the accurate measurement of voltage.

Furthermore, the present invention is configured such that it not only can measure critical current in a specific section while moving a superconducting tape at regular time intervals, but also can measure the critical current of a long superconducting tape while continuously moving the superconducting tape. Therefore, there are advantages in that the time required for the measurement of critical current is reduced, so that production costs can be reduced while production efficiency can be improved, and in that the local critical current of a superconducting tape is measured, so that critical current can be accurately measured while the superconducting tape can be protected.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A continuous critical current measurement apparatus for measuring a critical current of a superconducting tape while feeding the superconducting tape in a liquid nitrogen container, comprising:
   first and second wheel-type current terminals for transmitting a current to the superconducting tape; and
   first and second wheel-type voltage terminals for measuring voltages at the superconducting tape,
   wherein the superconducting tape is continuously supplied and fed by a reel-to-reel device, and the critical current of the superconducting tape is measured in real time using the first and second wheel-type current terminals and the first and second wheel-type voltage terminals while the superconducting tape is fed at constant linear velocity in contact with the first and second wheel-type current terminals and the first and second wheel-type voltage terminals,
   wherein each of the first and second voltage terminals comprises an inside voltage terminal disposed inside a corresponding current terminal with respect to a feeding path of the superconducting tape and an outside voltage terminal disposed outside the corresponding current terminal with respect to the feeding path, such that said measuring the voltages is enabled to an entire length of the superconducting tape between the two outside voltage terminals.

2. The continuous critical current measurement apparatus according to claim 1, wherein reference voltage is applied to the superconducting tape, current generated by the reference voltage is set to the critical current, and current is bypassed to a bypass shunt when abnormal current occurs.

3. The continuous critical current measurement apparatus according to claim 1, further comprising a supporting bar or a supporting roller disposed between the inside voltage terminals and configured to support the superconducting tape that is fed.

4. The continuous critical current measurement apparatus according to claim 1, further comprising a plurality of feed reels disposed between the inside voltage terminals and configured to allow the superconducting tape to be wound around the feed reels in multiple turns, thus enabling measurement of the critical current corresponding to a length of the wound superconducting tape.

5. The continuous critical current measurement apparatus according to claim 1, wherein the superconducting tape in contact with the current terminals is fed in contact with more than a half of a circumference of each of the current terminals.

6. The continuous critical current measurement apparatus according to claim 5, wherein the superconducting tape in contact with the voltage terminals is fed in a direction having a slope over a tangent line between two contact points of the superconducting tape in contact with the current terminals.

7. The continuous critical current measurement apparatus according to claim 1, wherein each of the current terminals and the voltage terminals is configured such that a tape receiving groove is formed along a circumference of the current or voltage terminal and such that a brush contact part is provided to protrude in axial direction from a center portion of the current or voltage terminal and is configured to apply current or measure voltage.

8. The continuous critical current measurement apparatus according to claim 7, wherein the current terminals and the voltage terminals are configured to perform current application and voltage measurement using a brush-type current lead-in structure and a brush-type voltage measurement structure, respectively.

9. The continuous critical current measurement apparatus according to claim 8, wherein each of the brush-type current lead-in structure or the brush-type voltage measurement structure comprises:
   one or more brush parts in contact with the brush contact part to correspond to a curvature of the brush contact part; and
   conducting wire parts connected to an external terminal so as to apply current to the brush parts or measure voltage at the brush parts.

10. The continuous critical current measurement apparatus according to claim 9, wherein the brush parts are connected to each other as one pair by a spring, thus adjusting contact pressures of the brush parts.

11. The continuous critical current measurement apparatus according to claim 8, wherein each of the brush-type current lead-in structure or the brush-type voltage measurement structure comprises:
   brush parts in contact with the brush contact part to correspond to a curvature of the brush contact part, and in at least one pair;
   control arms respectively connected to the paired brush parts to form a predetermined angle therebetween and connected to each other by a spring, thus adjusting contact pressures of the brush parts and balancing the brush parts; and
   conducting wire parts inserted into the control arms through first ends of the control arms and electrically connected to the brush parts, thus supplying current.

12. The continuous critical current measurement apparatus according to claim 1, wherein the superconducting tape is fed at constant velocity by a velocity control unit.

13. A continuous critical current measurement method comprising:
   measuring voltage at both ends of a superconducting tape using the continuous critical current measurement apparatus according to claim 2 by inputting voltage at both ends of the superconducting tape, which is measured at the voltage terminals, to a Digital Signal Processor (DSP) through an amplifier and an Analog Digital Converter (ADC);
   applying current to the current terminals while controlling a current source via a Digital Analog Converter (DAC) so as to maintain the measured voltage at 0.1 mV per meter; and
   measuring the current applied to the current terminals and tracking current, which is applied to maintain the voltage at 0.1 mV per meter, thus measuring critical current of the superconducting tape,
   wherein the voltage measured at the voltage terminals is proportional to an n-th power of the current, so that the critical current is linearized by obtaining a 1/n-th power (where n=10~40) of the measured voltage, thus supplying the linearized critical current to the DAC.

14. A continuous critical current measurement method comprising:
   measuring voltage at both ends of a superconducting tape using the continuous critical current measurement apparatus according to claim 1 by inputting voltage at both ends of the superconducting tape, which is measured at the voltage terminals, to a Digital Signal Processor (DSP) through an amplifier and an Analog Digital Converter (ADC);
   applying current to the current terminals while controlling a current source via a Digital Analog Converter (DAC) so as to maintain the measured voltage at 0.1 mV per meter; and
   measuring the current applied to the current terminals and tracking current, which is applied to maintain the voltage at 0.1 mV per meter, thus measuring critical current of the superconducting tape,
   wherein the voltage measured at the voltage terminals is proportional to an n-th power of the current, so that the critical current is linearized by obtaining a 1/n-th power (where n=10~40) of the measured voltage, thus supplying the linearized critical current to the DAC.

15. A continuous critical current measurement method comprising:
   measuring voltage at both ends of a superconducting tape using the continuous critical current measurement apparatus according to claim 12 by inputting voltage at both ends of the superconducting tape, which is measured at the voltage terminals, to a Digital Signal Processor (DSP) through an amplifier and an Analog Digital Converter (ADC);
   applying current to the current terminals while controlling a current source via a Digital Analog Converter (DAC) so as to maintain the measured voltage at 0.1 mV per meter; and
   measuring the current applied to the current terminals and tracking current, which is applied to maintain the voltage at 0.1 mV per meter, thus measuring critical current of the superconducting tape,
   wherein the voltage measured at the voltage terminals is proportional to an n-th power of the current, so that the critical current is linearized by obtaining a 1/n-th power (where n=10~40) of the measured voltage, thus supplying the linearized critical current to the DAC.

16. A continuous critical current measurement method comprising:
   measuring voltage at both ends of a superconducting tape using the continuous critical current measurement apparatus according to claim 5 by inputting voltage at both ends of the superconducting tape, which is measured at the voltage terminals, to a Digital Signal Processor (DSP) through an amplifier and an Analog Digital Converter (ADC);
   applying current to the current terminals while controlling a current source via a Digital Analog Converter (DAC) so as to maintain the measured voltage at 0.1 mV per meter; and
   measuring the current applied to the current terminals and tracking current, which is applied to maintain the voltage at 0.1 mV per meter, thus measuring critical current of the superconducting tape,
   wherein the voltage measured at the voltage terminals is proportional to an n-th power of the current, so that the critical current is linearized by obtaining a 1/n-th power (where n=10~40) of the measured voltage, thus supplying the linearized critical current to the DAC.

17. A continuous critical current measurement method comprising:
   measuring voltage at both ends of a superconducting tape using the continuous critical current measurement apparatus according to claim 7 by inputting voltage at both ends of the superconducting tape, which is measured at the voltage terminals, to a Digital Signal Processor (DSP) through an amplifier and an Analog Digital Converter (ADC);

applying current to the current terminals while controlling a current source via a Digital Analog Converter (DAC) so as to maintain the measured voltage at 0.1 mV per meter; and measuring the current applied to the current terminals and tracking current, which is applied to maintain the voltage at 0.1 mV per meter, thus measuring critical current of the superconducting tape, wherein the voltage measured at the voltage terminals is proportional to an n-th power of the current, so that the critical current is linearized by obtaining a 1/n-th power (where n=10~40) of the measured voltage, thus supplying the linearized critical current to the DAC.

* * * * *